(12) United States Patent
Hong et al.

(10) Patent No.: US 9,757,764 B2
(45) Date of Patent: Sep. 12, 2017

(54) MASK FOR DEPOSITION AND METHOD FOR ALIGNING THE SAME

(71) Applicant: Samsung Display Co., Ltd., Yongin, Gyeonggi-Do (KR)

(72) Inventors: Jae-Min Hong, Yongin (KR); Sang-Hyuk Park, Yongin (KR); Woo-Young Jung, Yongin (KR); Ha-Nul Kwen, Yongin (KR); Suk-Ho Kang, Yongin (KR); Jeong-Yeol Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 797 days.

(21) Appl. No.: 13/950,595

(22) Filed: Jul. 25, 2013

(65) Prior Publication Data

US 2014/0033974 A1 Feb. 6, 2014

(30) Foreign Application Priority Data

Jul. 31, 2012 (KR) ........................ 10-2012-0084200

(51) Int. Cl.
*C23C 14/00* (2006.01)
*B05C 21/00* (2006.01)
*C23C 14/04* (2006.01)
*H01L 51/00* (2006.01)

(52) U.S. Cl.
CPC .......... *B05C 21/005* (2013.01); *C23C 14/042* (2013.01); *H01L 51/0011* (2013.01); *Y10T 29/4978* (2015.01); *Y10T 29/49826* (2015.01)

(58) Field of Classification Search
CPC .................................................... C23C 14/042
See application file for complete search history.

(56) References Cited

U.S. PATENT DOCUMENTS

| 6,927,004 B2 | 8/2005 | Eurlings et al. |
| 2007/0275497 A1 | 11/2007 | Kwack et al. |
| 2010/0079694 A1 | 4/2010 | Yoshida et al. |

(Continued)

FOREIGN PATENT DOCUMENTS

| CN | 101273302 A | 9/2008 |
| CN | 102540744 A | 7/2012 |
| CN | 203440443 U | 2/2014 |

(Continued)

*Primary Examiner* — Timon Wanga
(74) *Attorney, Agent, or Firm* — Robert E. Bushnell, Esq.

(57) ABSTRACT

A mask for deposition for forming a pattern on a transparent substrate according to the present invention includes a mask member having a mask alignment mark penetratedly formed so as to be aligned with a substrate alignment mark formed on the transparent substrate; and an unevenness region formed on one surface of the mask member so as to be adjacent to the mask alignment mark and having protrusions and depressions on a surface thereof. In accordance with embodiments of the present invention, it is possible to prevent the alignment error of the mask from occurring by increasing the recognition rate of the align marks formed on the substrate and the mask. As a result, it is possible to reduce the manufacturing costs by reducing the defective rate of the organic light emitting diode (OLED) display device.

20 Claims, 7 Drawing Sheets

(56) References Cited

U.S. PATENT DOCUMENTS

2010/0080915 A1\*  4/2010  Masuda ................ C23C 14/042
                                                          427/282

FOREIGN PATENT DOCUMENTS

| JP | 2009-54512 A | 3/2009 |
|----|---|---|
| JP | 2010-027266 A | 2/2010 |
| KR | 10-2006-0017242 | 2/2006 |
| KR | 10-2006-0131276 | 12/2006 |
| KR | 10-0717805 | 5/2007 |
| KR | 10-2008-0007896 A | 1/2008 |

\* cited by examiner

MASK FOR DEPOSITION AND METHOD FOR ALIGNING THE SAME

CLAIM OF PRIORITY

This application makes reference to, incorporates the same herein, and claims all benefits accruing under 35 U.S.C. §119 from an application earlier filed in the Korean Intellectual Property Office on 31 Jul. 2012 and there duly assigned Serial No. 10-2012-0084200.

BACKGROUND OF THE INVENTION

Field of the Invention

An embodiment of the present invention relates generally to a mask for deposition and a method for aligning the same, and more particularly, to a mask for deposition and a method for aligning the same capable of precisely aligning a mask for deposition and a substrate.

Description of the Related Art

An organic light emitting diode (OLED) display device, which includes a hole injection electrode, an electron injection electrode, and an organic emission layer disposed therebetween, is a self-emitting type display device emitting light while annihilating holes injected from an anode and electrons injected from a cathode due to the recombination of the holes and electrons in the organic emission layer. In addition, the organic light emitting diode (OLED) display device exhibits high-quality characteristics such as lower power consumption, higher luminance, a wider viewing angle, and a higher reaction speed and therefore, has been focused as a next generation display device of a portable electronic device.

The organic light emitting diode (OLED) display device includes an organic light emitting display panel including a display substrate on which a thin film transistor and an organic light emitting element (OLED) are formed. The organic light emitting element includes an anode, a cathode, and an organic emission layer and emits light by forming excitons by holes and electrons injected from each of the anode and the cathode and shifting the excitons to a ground state.

In a flat panel display device such as the organic light emitting diode (OLED) display device, a vacuum deposition method for depositing corresponding materials such as an organic material or metals used as an electrode under the vacuum atmosphere to form a thin film on a flat panel, has been used. The vacuum deposition method is performed by disposing a substrate on which an organic thin film is grown in an interior of a vacuum chamber and by evaporating or sublimating the organic materials using a deposition source unit so as to be deposited on the substrate.

The deposition process is performed by aligning and attaching a mask for deposition including an open region, which is formed to correspond to a predetermined pattern to be formed on the substrate, on the substrate and performing a control so as to deposit a material for forming an evaporated pattern on the substrate through the open region. In the deposition process, it is important to correctly align and attach the mask for deposition on the substrate without errors.

When the substrate is a transparent substrate, however, a contrast difference between alignment marks, in particular, an angle alignment mark and a substrate (and a mask) is small due to the reflected light from the mask surface at the time of performing the measurement by the measuring device and therefore, it is difficult to confirm a location of the angle alignment mark.

The above information disclosed in this Background section is only for enhancement of understanding of the background of the described technology and therefore it may contain information that does not form the prior art that is already known in this country to a person of ordinary skill in the art.

SUMMARY OF THE INVENTION

An aspect of the present invention provides a mask for deposition and a method for aligning the same capable of preventing an alignment error between a substrate and a mask from occurring.

Another aspect of the present invention provides a mask for deposition and a method for aligning the same capable of increasing a recognition rate of alignment marks formed on a substrate and a mask.

An embodiment of the present invention provides a mask for deposition for forming a pattern on a transparent substrate including: a mask member having a mask alignment mark penetratedly formed so as to be aligned with a substrate alignment mark formed on the transparent substrate; and an unevenness region formed on one surface of the mask member so as to be adjacent to the mask alignment mark and having protrusions and depressions on a surface thereof.

The unevenness region may diffused-reflect incident light.

The unevenness region may be coated with a diffused-reflection material.

The unevenness region may be formed at a height lower than one surface of the mask for deposition.

The unevenness region may be formed by half etching.

The mask for deposition may further include a flat region formed between the mask alignment mark and the unevenness region and having a flat surface.

The flat region may be formed along a periphery of the mask alignment mark.

The flat region may reflect incident light.

The flat region may be coated with a light reflection material.

Another embodiment of the present invention provides a method for aligning a mask, including steps of: preparing a transparent substrate having a substrate alignment mark and an angle alignment mark formed adjacent to the substrate alignment mark formed on one surface of the transparent substrate; disposing a mask for deposition on the transparent substrate, the mask including a mask member having a mask alignment mark penetratedly formed so as to be aligned with a substrate alignment mark formed on the transparent substrate and an unevenness region formed on one surface of the mask member so as to be adjacent to the mask alignment mark, the unevenness region having protrusions and depressions on a surface thereof, the unevenness region facing the transparent substrate; aligning the substrate alignment mark and the mask alignment mark at a predetermined location; and aligning the angle alignment mark so that the angle alignment mark is disposed at a predetermined location while overlapping the unevenness region.

In the steps of aligning of the location or the aligning of the angle, after an alignment state is measured by a measuring device that is disposed so as to face the unevenness region, an alignment location of the transparent substrate or the mask for deposition may be adjusted.

The measuring device may be a measuring device mounted with a CCD camera.

According to the embodiments of the present invention, it is possible to prevent the alignment error of the mask from occurring by increasing the recognition rate of the alignment marks formed on the substrate and the mask.

As a result, it is possible to reduce the manufacturing costs by reducing the defective rate of the organic light emitting diode (OLED) display device.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, a mask for deposition and a method for aligning the same according to the present invention will be described in detail with reference to the accompanying drawings. However, the present invention is not limited to the exemplary embodiments disclosed below but may be implemented in various types. Therefore, the present exemplary embodiments are provided to fully describe the present invention and fully inform those skilled in the art of the scope of the present invention. Like reference numerals designate like elements throughout the specification.

In the drawings, the thickness of layers, films, panels, regions, etc., are exaggerated for clarity. Further, the thicknesses of some layers and regions are exaggerated in the drawings for better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements.

In addition, throughout the specification, "on" means one located above or below a targeted portion and does not necessarily mean one located on the top based on a gravity direction.

Figure 1:
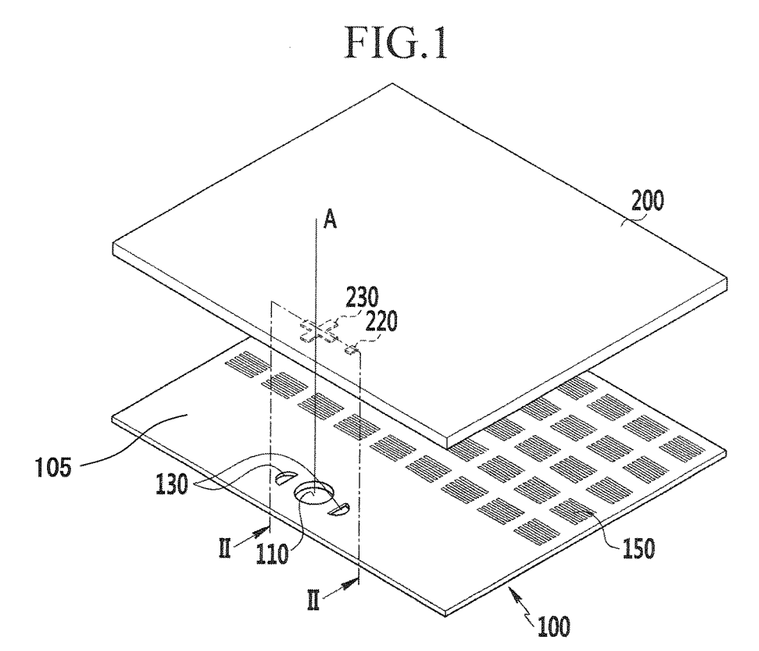
FIG. 1 is a schematic oblique view illustrating a mask for deposition and a method for aligning a substrate according to an embodiment of the present invention.
Figure 2:
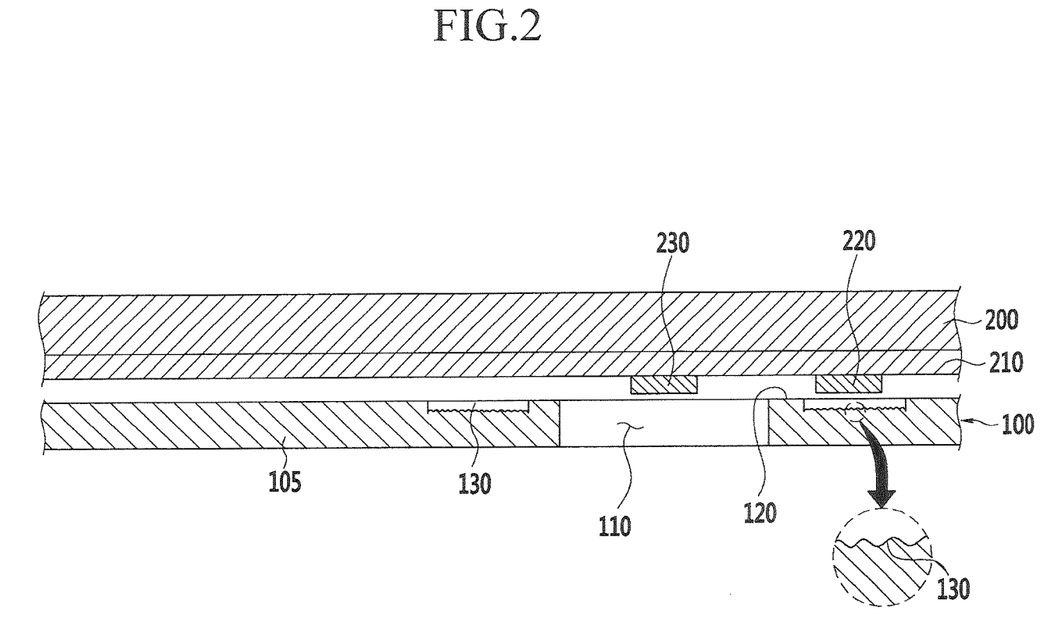
FIG. 2 is a schematic cross-sectional view taken along line II-II of FIG. 1.

FIG. 1 is a schematic oblique view illustrating a mask for deposition and a method for aligning a substrate according to an embodiment of the present invention and FIG. 2 is a schematic cross-sectional view taken along line II-II of FIG. 1

In reference to FIGS. 1 and 2, a mask 100 for deposition according to an embodiment of the present invention is a mask for forming a pattern on a transparent substrate 200 and is configured to include a mask member 105 and an unevenness region 130.

The transparent substrate 200 is a substrate for forming an organic light emitting diode (OLED) display device and may be further provided with a transparent barrier film 210. The transparent substrate 200 may be made of a flexible material. Although not illustrated in FIG. 1, a first electrode layer serving as an anode is formed on the transparent barrier film 210, an organic emission layer is formed on the first electrode layer, and a second electrode layer serving as a cathode is formed on the organic emission layer.

The first electrode layer may be formed to have a predetermined pattern on the transparent substrate 200 by vacuum deposition or sputtering and the second electrode layer may be molded to have a predetermined pattern by the vacuum deposition, and the like, after the first electrode layer and the organic emission layer are formed. Further, the organic emission layer may be formed by deposition, spin coating, inkjet printing, and the like. The organic emission layer may have a structure of a multilayered film at least including an emission layer. For example, an electron transport layer (ETL) may be disposed between the second electrode layer and the organic emission layer, a hole transport layer (HTL) may be disposed between the first electrode layer and the organic emission layer, a hole injection layer (HIL) may be disposed between the first electrode layer and the hole transport layer, an electron injection layer (EIL) may be disposed between the second electrode layer and the electron transport layer (ETL). Due to the foregoing multilayer structure, holes and electrons can be more smoothly transported into the organic emission layer.

In the manufacture of the organic light emitting diode (OLED) display device having the foregoing configuration, the mask 100 for deposition formed with an open region 150 so as to correspond to each pattern is used in a process of adopting a deposition method so as to form an electrode layer having a predetermined pattern and the organic emission layer. The mask for deposition adheres to the transparent substrate 200 by a vacuum adsorption means or a mask support means such as a magnet unit.

The mask 100 for deposition and the transparent substrate 200 are accurately disposed at a predetermined location so as to accurately form the pattern at a desired location. In FIG. 1, line A indicates an alignment line for aligning the mask 100 for deposition and the transparent substrate 200. A substrate alignment mark 230 and an angle alignment mark 220 are formed on one surface of the transparent substrate 200 for alignment. The substrate alignment mark 230, which is a mark for confirming an alignment state with a mask, is a means for determining whether or not to be matched with the mask alignment mark 110 to be described below. The present embodiment describes that the mark is formed in a cross (+) shape, but is not limited thereto and therefore, the mark may be formed in various shapes of diagrams. The angle alignment mark 220 may be disposed while an angle of a substrate deviates from a predetermined reference even though the substrate alignment mark 230 is matched with the mask alignment mark 110. Therefore, the angle alignment mark 220 is adjacently formed to the substrate alignment mark 230 which is a means for preventing a warpage of a substrate. The present embodiment describes that the mark is formed in a quadrangular shape, but is not limited thereto, and therefore the mark may be formed in various shapes of diagrams. The substrate alignment mark 230 and the mask alignment mark 110 are adjacently formed to each other but are spaced apart from each other with a predetermined distance.

The mask member 105 is a plate-shaped member including the open region (i.e., a deposition pattern region) 150 formed to correspond to a pattern of an object to be deposited and a material of the mask member 105 may be a metal material such as metal or alloy, a functional polymer, or a mixture of polymer and metal. The open region 150 may be provided with a plurality of slits that are formed by penetrating through the mask 100 for deposition. The open region 150 may have a pattern corresponding to the first electrode layer, the organic emission layer, and the second electrode layer.

The mask alignment mark 110, which is a mark for aligning the transparent substrate 200 and the mask 100 for deposition, is formed as the open region by penetrating the mask member 105. The present embodiment of the present invention describes that the mask alignment mark 110 has a circular shape, but is not limited thereto, and therefore the mask alignment mark 110 may have various shapes of polygons, such as triangle, quadrangle, and the like. When the mask alignment mark 110 and the substrate alignment mark 230 are aligned, an area of the mask alignment mark 110 may be larger than that of the substrate alignment mark 230 so that the substrate alignment mark 230 may be disposed within a region of the mask alignment mark 110. Further, for the precise alignment with the transparent substrate 200, at least two mask alignment marks 110 may be formed at an outside of the mask member 105.

The unevenness region 130 is formed on one surface of the mask member 105 so as to be adjacent to the mask alignment mark 110 and the unevenness region 130 having protrusions and depressions is formed on a surface thereof. As shown in FIG. 2, the unevenness region 130 has a bent surface on which a plurality of ridges and valleys are repeated. Due to the foregoing features, the unevenness region 130 may diffuse-reflect incident light. At the time of performing measurement by a measuring device 300 (in reference to FIG. 6), the unevenness region 130 appears darker than periphery by diffused-reflecting incident light from the measuring device. When the angle alignment mark 220 is disposed in a region rather than in the unevenness region 130, it is difficult to recognize the angle alignment mark 220 due to light reflected from the surface of the mask 100 for deposition. In other words, in the present embodiment where the angle alignment mark 220 is disposed within the unevenness region 130 as shown in FIG. 2, it is possible to prevent the angle alignment mark 220 of the transparent substrate 200 disposed on the unevenness region 130 from not being recognized by the measuring device 300 due to reflected light, by preventing the incident light from the measuring device 300 from being reflected from the unevenness region 130.

Figure 3:
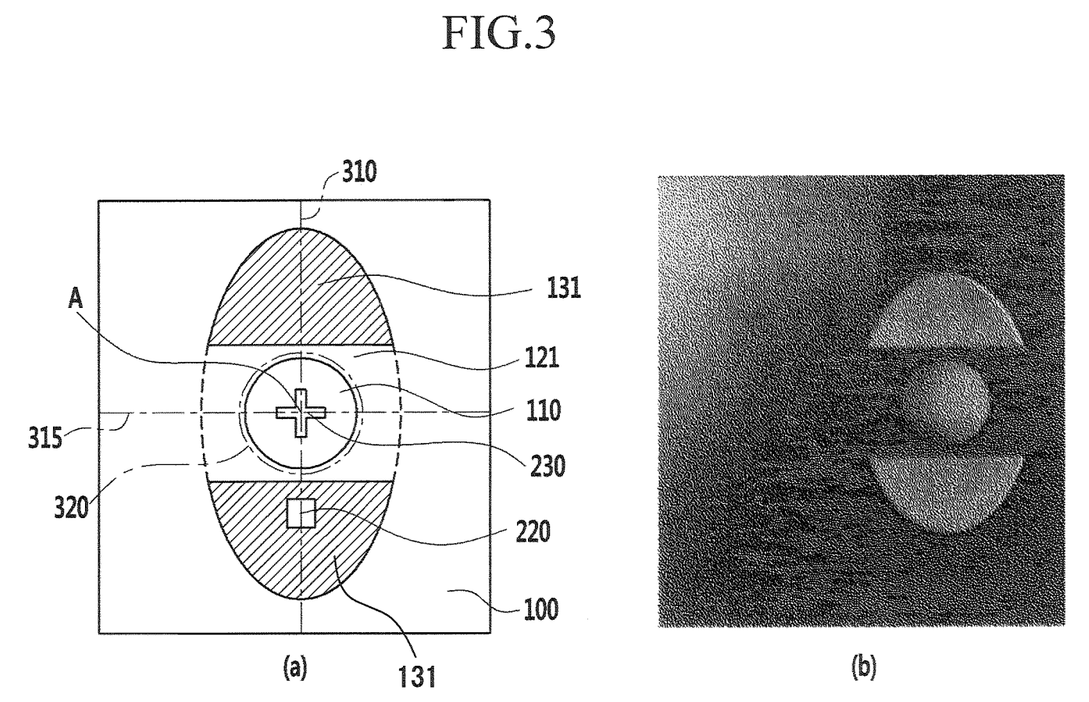
FIGS. 3 through 5 are top plan views illustrating a case in which an alignment of a mask for deposition and a transparent substrate is measured by a measuring device according to an embodiment of the present invention.
Figure 4:
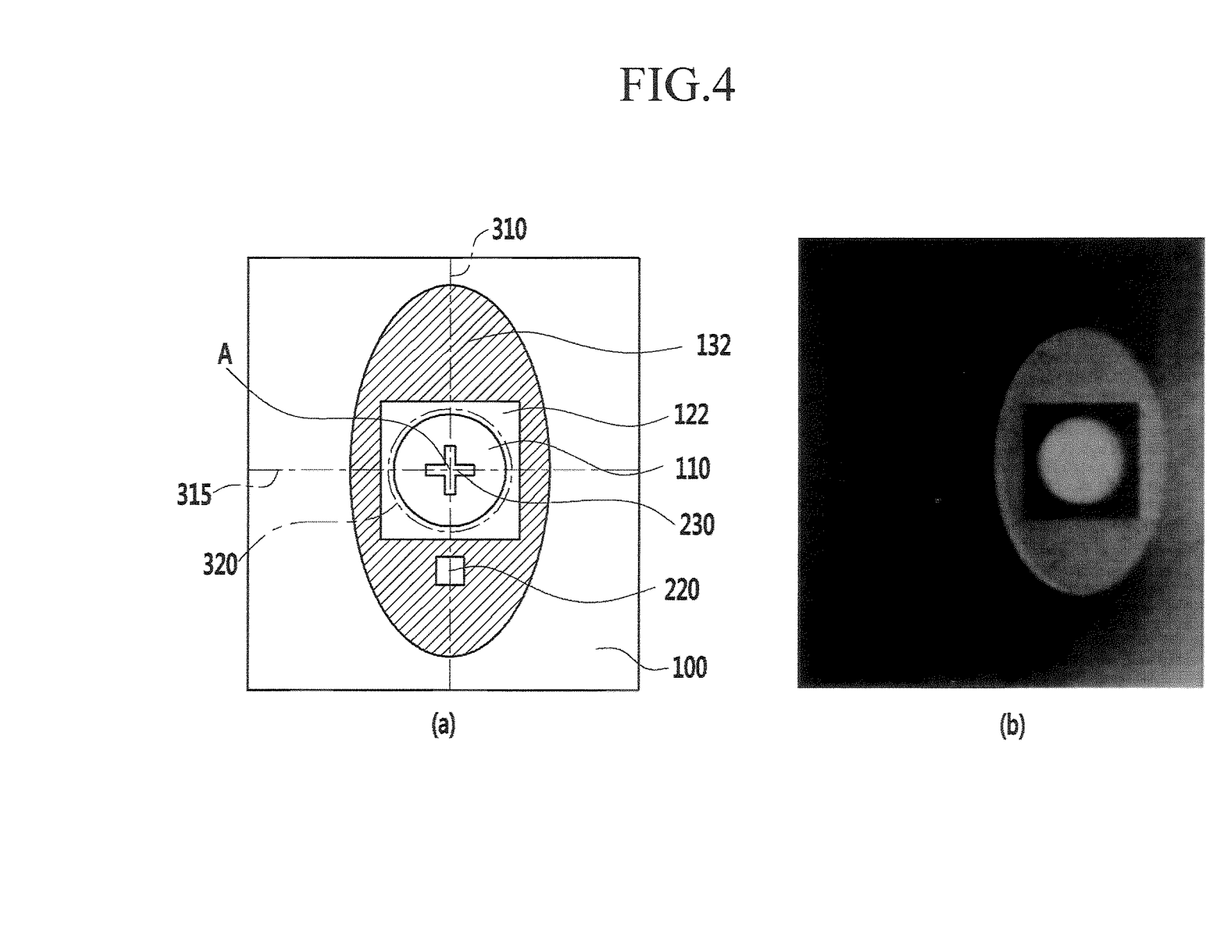
Figure 5:
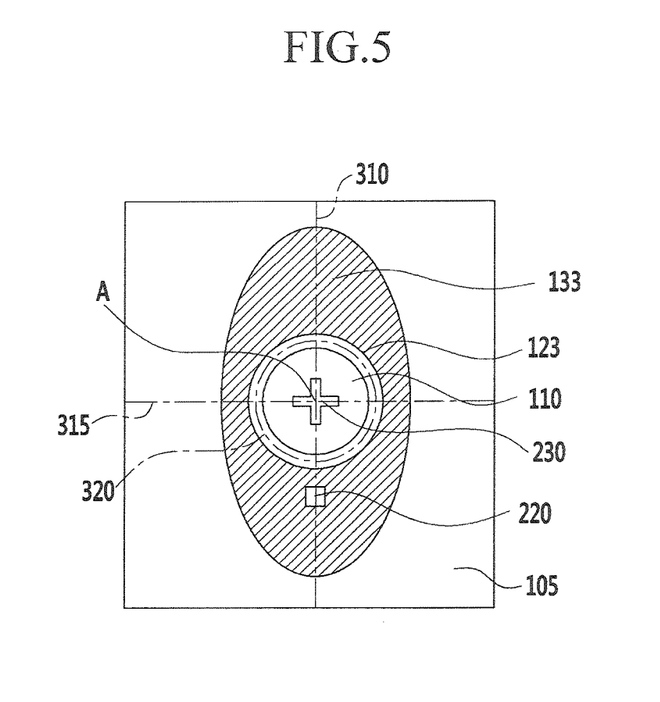

FIGS. 3 through 5 are top plan views illustrating the case in which the alignment of the mask for deposition and the transparent substrate is measured by the measuring device according to an embodiment. FIGS. 3(b) and 4(b) illustrate photographs in which the mask for deposition according to the embodiment of the present invention is taken by a charge-coupled device (CCD) camera.

As illustrated in FIG. 3(a), an unevenness region 131 may be formed around the mask alignment mark 110 by being divided into at least two while being spaced apart from the mask alignment mark 110; as illustrated in FIGS. 4(a) and 5, an unevenness region 132, 133 may be formed as a continuous element to surround the periphery of the mask alignment mark 110 while being spaced apart from the mask alignment mark 110.

The present embodiments of the present invention describe that the entire shape of the unevenness region 130 has an oval shape, but are not limited thereto. Therefore, the unevenness region 130 may have various shapes. The area of the unevenness region 130 may be formed to be larger than that of the angle alignment mark 220 so that the angle alignment mark 220 disposed within the unevenness region 130 may be easily differentiated.

As shown in FIG. 2, the unevenness region 130 may be formed to have a height lower than one surface of the mask 100 for deposition by partially cutting the surface of the mask 100 for deposition. In this case, the unevenness region 130 may be formed by one selected from various processes, such as half etching, laser, a photolithography process, a sand blast process, and the like. When the unevenness region 130 is formed at a height lower than one surface of the mask 100 for deposition, the unevenness region 130 is not damaged even though the mask 100 for deposition adheres to the transparent substrate 200.

The unevenness region 130 may be coated with a diffused reflection material that may diffused-reflect light according to the reaction of a wavelength of light with a molecular particle of a material. In this case, it is possible to more effectively diffused-reflect the incident light.

A flat region 120 (121, 122, 123 as shown respectively in FIG. 3(a) and FIG. 4(a) and FIG. 5) with a flat surface may be further disposed between the mask alignment mark 110 and the unevenness region 130. The flat region 120 may reflect the incident light. The mask alignment mark 110 is opened to transmit light that is incident in a substrate direction, while the flat region 120 reflects light that is incident in the substrate direction, such that the mask alignment mark 110 is displayed at low brightness and the flat region 120 is displayed at high brightness at the time of performing the measurement by the measuring device 300. As such, the difference in contrast between the mask alignment mark 110 and the flat region 120 is distinct so that the mask alignment mark 110 can be easily differentiated. The flat region 120 has a difference in contrast from the diffused reflection region 130 according to the foregoing principle, such that the mask alignment mark 110 and the unevenness region 130 can be easily differentiated.

The flat region 120 may be formed along a boundary of the mask alignment mark 110 so as to easily differentiate the mask alignment mark 110 and may be formed by being coated with a light reflection material reflecting light that is incident according to the reaction of a wavelength of light with a molecular particle of a material.

As shown in FIG. 3(a), when the unevenness region 131 is formed around the mask alignment mark 110 by being divided into at least two, the flat region 121 is formed to surround the boundary of the mask alignment mark 110 to geometrically isolate the unevenness region 131 and the mask alignment mark 110; as illustrated in FIGS. 4(a) and 5, the flat regions 122 and 123 are formed to surround the boundary of the mask alignment mark 110 but may be formed in some region of the inside of the unevenness regions 132 and 133.

The present embodiment of the present invention describes that the entire shape of the flat region 120 surrounding the mask alignment mark 110 has a quadrangle 122 (see FIG. 4) and a circle 123 (see FIG. 5), but is not limited thereto and may be variously changed among shapes that can space between the mask alignment mark 110 and the flat region 130 while surrounding the mask alignment mark 110.

Hereinafter, the use of the mask for deposition and the method for aligning the same according to the exemplary embodiment will be described with reference to the accompanying drawings.

Figure 6:
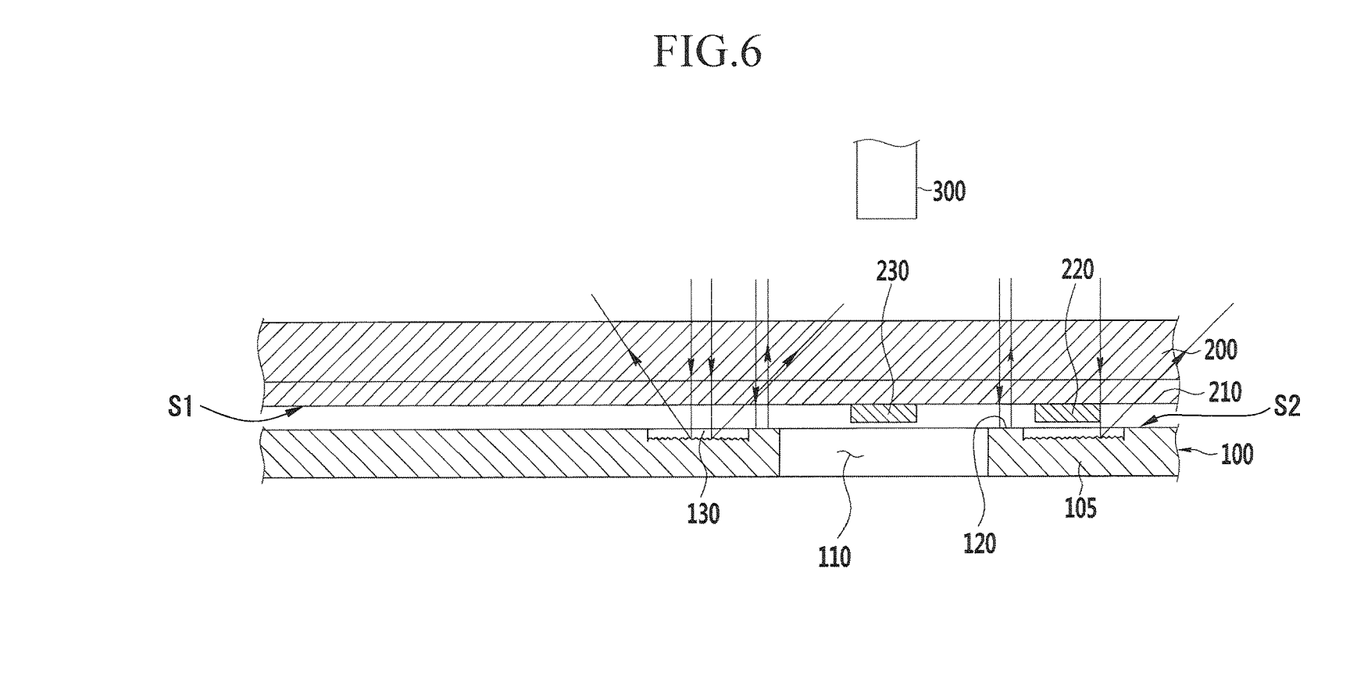
FIG. 6 is a schematic cross-sectional view illustrating a mask for deposition and a method for aligning a substrate according to an embodiment of the present invention.

FIG. 6 is a schematic view illustrating a mask for deposition and a method for aligning a substrate according to an embodiment of the present invention.

Referring to FIGS. 1 and 6, the transparent substrate 200 having one surface S1 on which the substrate alignment mark 230 and the angle alignment mark 220 adjacently formed to the substrate alignment mark 230 are formed is prepared and then, the transparent substrate 200 is seated on a substrate support member (not shown). The features of the substrate alignment mark 230 and the angle alignment mark 220 adjacently formed thereto are already described.

The mask 100 for deposition according to the embodiment of the present invention is disposed on the transparent substrate 200 and the transparent substrate 200 is adhered to the mask 100 for deposition by the mask support means. In this case, the mask 100 for deposition on which the unevenness region 130 is formed is disposed so that one surface S2 thereof faces the transparent substrate 200.

Next, the substrate alignment mark 230 and the mask alignment mark 110 are aligned so as to be disposed at a predetermined location. In this case, the locations of the substrate alignment mark 230 and the mask alignment mark 110 are confirmed by measuring the alignment state by the measuring device 300 that is disposed so as to face the unevenness region 130. The predetermined location refers to a location that is input to the measuring device 300 mounted with a CCD camera in advance and may correspond to, for example, reference lines 310, 315, and 320 illustrated in FIGS. 3 through 5. A central portion of the substrate alignment mark 230 having a cross shape is disposed at a central portion at which a vertical reference line 310 intersects a vertical reference line 315, and a circular central line 320 may be formed to have the same size as the circular mask alignment mark 110 so as to match the mask alignment mark 110 (for convenience, shown in the drawings so as not to match each other). The shapes of the reference lines 310, 315, and 320 are by way of example and therefore, the reference lines 310, 315, and 320 may be formed to have various shapes according to colors, shapes, and the like, of the alignment mark.

When being photographed by the CCD camera that is mounted in the measuring device 300, the brightness is reduced by transmitting the incident light from the CCD camera through the mask alignment mark 110 of the mask 100 for deposition that is an opened region, while the brightness is increased due to the reflection of the incident light from the flat region 120. The mask alignment mark 110 may be easily identified due to the distinct difference in contrast between the mask alignment mark 110 and the flat region 120, such that it may be detected whether the mask 100 for deposition is disposed at a desired location. In addition, the substrate alignment mark 230 located at a center of the mask alignment mark 110 reflects the incident light to increase the brightness, such that it is possible to easily differentiate the mask alignment mark 110. When the substrate alignment mark 230 or the mask alignment mark 110 are not disposed at a predetermined location, the substrate support member moves or the transparent substrate 200 or the mask 100 for deposition moves through a mask driving member (not shown) so as to be disposed at a predetermined location.

Next, the angle alignment mark 220 is aligned so as to be disposed at a predetermined location while the angle alignment mark 220 overlaps the unevenness region 130. In this case, the locations of the angle alignment mark 220 and the unevenness region 130 are confirmed by measuring the alignment state by the measuring device 300 that is disposed so as to face the unevenness region 130. The predetermined location refers to a location that is input to the measuring device 300 mounted with the CCD camera and may correspond to, for example, the vertical reference line 310 illustrated in FIGS. 3 through 5. Both of the substrate alignment mark 230 and the angle alignment mark 220 are aligned so as to match the vertical reference line 310 so that it is possible to prevent the transparent substrate 200 from being disposed while being deviated from the mask 100 for deposition. When the angle alignment mark 220 is not disposed at the predetermined location, the substrate support member moves or the transparent substrate 200 or the mask 100 for deposition moves through the mask driving member so as to be disposed at the predetermined location.

When being photographed by the CCD camera mounted with the measuring device, the incident light from the CCD camera is diffused-reflected la the unevenness region 130 to reduce the brightness and is reflected by the flat region adjacent to the unevenness region 130 to increase the brightness, such that the difference in brightness between the unevenness region 130 and the flat region 120 is distinct. When the brightness is reduced by the unevenness region 130 so as to dispose the angle alignment mark 220 within the unevenness region 130, the angle alignment mark 220 can be easily recognized.

By the foregoing method, a process of aligning the transparent substrate 200 to the mask 100 for deposition and then, deposition of the organic material is performed.

Hereinafter, the use of the mask for deposition and an effect of the method for aligning the same according to the exemplary embodiment will be described with reference to the accompanying drawings.

Figure 7:
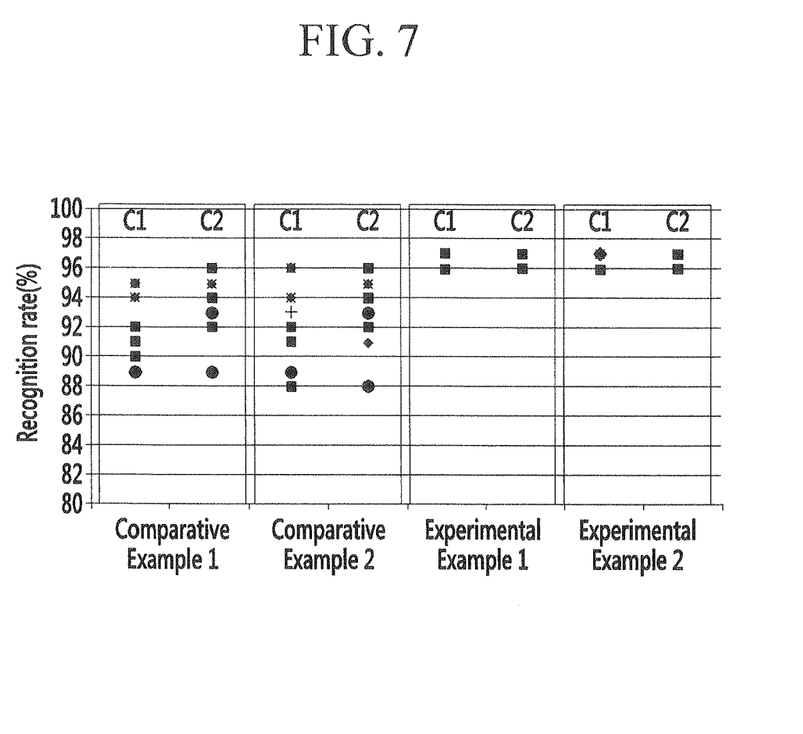
FIG. 7 is a graph illustrating a recognition rate of an alignment mark after the mark for deposition according to the embodiment of the present invention and a transparent substrate are aligned and the alignment mark is photographed.

FIG. 7 is a graph illustrating a recognition rate of an alignment mark after the mark for deposition according to the embodiment of the present invention and a transparent substrate are aligned and the alignment mark is photographed.

A recognition rate shows how much the shape of the stored image and the shape actually measured by the measuring device overlap each other after an image for the shapes of the alignment marks 220 and 230 formed on the transparent substrate 200 and the mask alignment mark 110 is stored in the measuring device 300, that is, a ratio of an overlapping area with the entire area of the shape. That is, when the shape of the stored image and the actually measured shape completely overlap, the recognition rate corresponds to 100% and when the shape of the stored image and the actually measured shape completely do not overlap, the recognition rate corresponds to 0%. It is preferable that the recognition rate is experimentally 95% or more.

Experimental Example 1 of FIG. 7 is an alignment mark recognition rate after being aligned using the mask for deposition formed as shown in FIG. 3 and Experimental Example 2 is an alignment mark recognition rate after being aligned using the mask for deposition formed as shown in FIG. 4. The deposition mask of Comparative Example 1 is formed to have the same shape as Experimental Example 1, but does not have the unevenness region. The deposition mask of Comparative Example 2 is formed to have the same shape as Experimental Example 2, but does not have the unevenness region. Further, each of the masks for deposition of Experimental Examples and Comparative Examples includes two mask alignment marks 110 and includes the substrate alignment mark 230, the angle alignment mark 220, the unevenness region 130, the flat region 120, and the like, to correspond to the mask alignment mark 110. The two alignment marks 110 are measured by the two measuring device 300, which are each shown by C1 and C2 in FIG. 7.

It may be appreciated that Comparative Example 1 and Comparative Example 2 show a distribution of the recognition rate of 88 to 96% according to the experimental frequency, while both of the Experimental Example 1 and Experimental Example 2 show the recognition rate of 96% or more. It may be appreciated that the alignment mark recognition rates of the masks for deposition formed according to the embodiments of the present invention are higher by diffused-reflecting the incident light in the unevenness region.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A deposition mask forming a pattern on a transparent substrate, the deposition mask comprising a mask member that comprises:
   a mask alignment mark penetratedly formed so as to be aligned with a substrate alignment mark formed on the transparent substrate; and
   an unevenness region formed on one surface of the mask member so as to be adjacent to the mask alignment mark, a surface of the unevenness region comprising protrusions and depressions, wherein the mask alignment mark is not overlapped by the unevenness region.

2. The mask of claim 1, wherein the unevenness region diffused-reflects light incident on the surface of the unevenness region, wherein the unevenness region is coated with a diffused-reflection material, the unevenness region to be aligned with an angle alignment mark formed on the transparent substrate.

3. The mask of claim 1, wherein the unevenness region has an oval shape and is arranged only in a vicinity of the mask alignment mark.

4. The mask of claim 1, wherein the mask member further comprises a first major surface facing the transparent substrate and a second and opposite major surface facing away from the transparent substrate, the unevenness region being recessed from the first major surface, the unevenness region facing the transparent substrate and being interposed between a plane defined by the first major surface and a plane defined by the second major surface.

5. The mask of claim 4, wherein the unevenness region is formed by half etching.

6. The mask of claim 1, further comprising a flat region having a flat surface, the unevenness region being spaced-apart from the mask alignment mark by the flat region.

7. The mask of claim 6, wherein the flat region is formed along a periphery of the mask alignment mark.

8. The mask of claim 6, wherein the flat region reflects light incident on the flat surface of the flat region, wherein the flat region is coated with a light reflection material.

9. The mask of claim 1, wherein the mask member further comprises a deposition pattern region occupying a majority of a surface area of the mask member and including patterns that include a plurality of slits therein corresponding to a pattern of a material to be deposited on the transparent substrate, each of the mask alignment mark and the unevenness region being external to and being spaced-apart from the deposition pattern region and having a size much smaller than that of the deposition pattern region.

10. The mask of claim 1, wherein:
    the mask alignment mark penetrates the mask member; and
    the unevenness region is disposed only on two opposite sides of the mask alignment mark, the unevenness region comprising a non-flat surface which diffused-reflects light incident on the non-flat surface of the unevenness region, the unevenness region to allow the angle alignment mark to be more easily recognized when aligned with the unevenness region.

11. The mask of claim 1, wherein the unevenness region is formed so as to surround an entirety of the mask alignment mark, the unevenness region appearing darker than a periphery thereof upon being illuminated by incident light, the unevenness region occupying a small minority of a surface area of the mask member and being arranged only in a vicinity of the mask alignment mark.

12. The mask of claim 1, the mask member further comprising a flat region formed so as to geometrically isolate the mask alignment mark from the unevenness region by spacing apart the unevenness region from the mask alignment mark, the flat region having a flat surface that appears brighter than that of the unevenness region when illuminated by incident light.

13. A mask for deposition for forming a pattern on a transparent substrate, the mask comprising a mask member that comprises:
    a mask alignment mark penetrating the mask member; and
    an unevenness region disposed on at least two opposite sides of the mask alignment mark, the unevenness region comprising a non-flat surface which diffused-reflects light incident on the non-flat surface of the unevenness region, wherein the mask alignment mark is not overlapped by the unevenness region.

14. The mask of claim 13, the mask aligning to a transparent substrate by a process, comprising:
    preparing the transparent substrate having a substrate alignment mark and an angle alignment mark formed adjacent to the substrate alignment mark formed on one surface of the transparent substrate;
    disposing the mask for deposition on the transparent substrate;
    aligning the substrate alignment mark and the mask alignment mark at a predetermined location; and
    aligning the angle alignment mark so that the angle alignment mark is disposed at a predetermined location while overlapping the unevenness region.

15. The mask of claim 14, the process further comprising:
    in the steps of aligning of the location or the aligning of the angle,
    after an alignment state is measured by a measuring device that is disposed so as to face the unevenness region, an alignment location of the transparent substrate or the mask for deposition is adjusted.

16. The mask of claim 14, wherein:
    the measuring device is a measuring device mounted with a CCD camera and a light source.

17. The mask for deposition of claim 13, wherein the non-flat surface of the unevenness region is coated with a diffused-reflection material.

18. The mask for deposition of claim 13, wherein the mask member further comprises a first major surface opposite a second major surface, wherein the unevenness region is arranged between the first and the second major surfaces of the mask member, is recessed from the first major surface of the mask member and faces in a same direction as the first major surface.

19. The mask for deposition of claim 13, wherein the unevenness region is formed so as to surround an entirety of the mask alignment mark.

20. The mask for deposition of claim 13, the mask member further comprising a flat region, the mask alignment mark being spaced-apart from the unevenness region by the flat region, the flat region having a flat surface that is more reflective to incident light than the unevenness region.

\* \* \* \* \*